(12) United States Patent
Chuo et al.

(10) Patent No.: US 10,600,935 B2
(45) Date of Patent: Mar. 24, 2020

(54) NITRIDE BASED SEMICONDUCTOR DEVICE WITH IMPROVED LATTICE QUALITY

(71) Applicant: XIAMEN SAN'AN OPTOELECTRONICS CO., LTD., Xiamen (CN)

(72) Inventors: Chang-Cheng Chuo, Xiamen (CN); Shengchang Chen, Xiamen (CN); Heqing Deng, Xiamen (CN)

(73) Assignee: Xiamen San'An Optoelectronics Co., Ltd., Fujian (CN)

( * ) Notice: Subject to any disclaimer, the term of this patent is extended or adjusted under 35 U.S.C. 154(b) by 0 days.

(21) Appl. No.: 16/423,492

(22) Filed: May 28, 2019

(65) Prior Publication Data

US 2019/0280160 A1  Sep. 12, 2019

Related U.S. Application Data

(63) Continuation-in-part of application No. PCT/CN2018/078652, filed on Mar. 12, 2018.

(30) Foreign Application Priority Data

Sep. 14, 2017 (CN) .......................... 2017 1 0827123

(51) Int. Cl.
*H01L 33/32* (2010.01)
*H01L 33/12* (2010.01)

(52) U.S. Cl.
CPC ............ *H01L 33/325* (2013.01); *H01L 33/12* (2013.01)

(58) Field of Classification Search
None
See application file for complete search history.

(56) References Cited

U.S. PATENT DOCUMENTS

2002/0020850 A1* 2/2002 Shibata ............... H01L 21/0242
257/183
2009/0001409 A1* 1/2009 Takano ................... H01L 33/12
257/103
(Continued)

FOREIGN PATENT DOCUMENTS

| CN | 105489723 A | 4/2016 |
|---|---|---|
| CN | 106784216 A | 5/2017 |
| CN | 107634128 A | 1/2018 |

OTHER PUBLICATIONS

Cheng, Kai, et al., "Flat GaN Epitaxial Layers Grown on Si(111) by Metalorganic Vapor Phase Epitaxy Using Step-Graded AlGaN Intermediate Layers." Journal of Electronic Materials, vol. 35, No. 4, 2006, pp. 592-598., doi:10.1007/s11664-006-0105-1. (Year: 2006).*

(Continued)

*Primary Examiner* — J. E. Schoenholtz
(74) *Attorney, Agent, or Firm* — Rosenberg, Klein & Lee

(57) ABSTRACT

A nitride based semiconductor device including a buffer layer, a three-dimensional stress tuning layer formed on the buffer layer, a first-type semiconductor layer formed on the three-dimensional stress tuning layer, an active layer formed on the first-type semiconductor layer, and a second-type semiconductor layer formed on the active layer. The three-dimensional stress tuning layer and the buffer layer cooperatively define an interface therebetween. The interface has a three-dimensional composition distribution.

9 Claims, 3 Drawing Sheets

(56) References Cited

U.S. PATENT DOCUMENTS

2014/0332849 A1* 11/2014 Jang .................. H01L 29/7783
257/190
2018/0145214 A1  5/2018 Chen et al.

OTHER PUBLICATIONS

He, Chengyu, et al. "Growth and Characterization of Ternary AlGaN Alloy Nanocones across the Entire Composition Range." ACS Nano, vol. 5, No. 2, 2011, pp. 1291-1296., doi:10.1021/nn1029845 (Year: 2011).*
Search Report issued to PCT application No. PCT/CN2018/078652 by the CNIPA dated May 31, 2018.
Search Report appended to an Office Action, which was issued to Chinese counterpart application No. 201710827123.6 by the CNIPA dated Oct. 8, 2018, with an English translation thereof.

* cited by examiner

NITRIDE BASED SEMICONDUCTOR DEVICE WITH IMPROVED LATTICE QUALITY

CROSS-REFERENCE TO RELATED APPLICATION

This application is a continuation-in-part (CIP) of International Application No. PCT/CN2018/078652, filed on Mar. 12, 2018, which claims priority to Chinese Invention Patent Application No. 201710827123.6, filed Sep. 14, 2017.

FIELD

The disclosure relates to a semiconductor device, more particularly to a nitride based semiconductor device.

BACKGROUND

In recent years, with improvements in technology and efficiency, ultraviolet light emitting diodes (UV LEDs), with their longer lifespan and smaller volume, have been slowly replacing mercury lamps of lower efficiency. With the Minamata Convention on Mercury coming into effect in 2020, the global ban on mercury would further expedite the rise of application of the UV LEDs.

A conventional deep UV LED has an aluminum nitride (AlN)-based buffer layer. FIG. 1 shows an epitaxial structure of the conventional deep UV LED. An n-type nitride semiconductor layer 130, a quantum well light emitting layer 140 and a p-type nitride semiconductor layer 150 are formed sequentially on the AlN-based buffer layer 120 grown on a substrate 110. In particular, because there is lattice mismatch between the n-type nitride semiconductor layer and the AlN-based buffer layer, high compressive stress is experienced by the latter-grown aluminum gallium nitride (AlGaN)-based layers such as the quantum well light emitting layer and the p-type nitride semiconductor layer. This causes an increase in the dislocation density and affects the lattice quality as well as the luminous efficiency of the deep UV LED.

SUMMARY

Therefore, the object of the disclosure is to provide a semiconductor device that can alleviate at least one of the drawbacks of the prior art.

According to the disclosure, a nitride based semiconductor device includes a buffer layer, a three-dimensional stress tuning layer formed on the buffer layer, a first-type semiconductor layer formed on the three-dimensional stress tuning layer, an active layer formed on the first-type semiconductor layer, and a second-type semiconductor layer formed on the active layer.

The three-dimensional stress tuning layer and the buffer layer cooperatively define an interface therebetween. The interface has a three-dimensional composition distribution.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
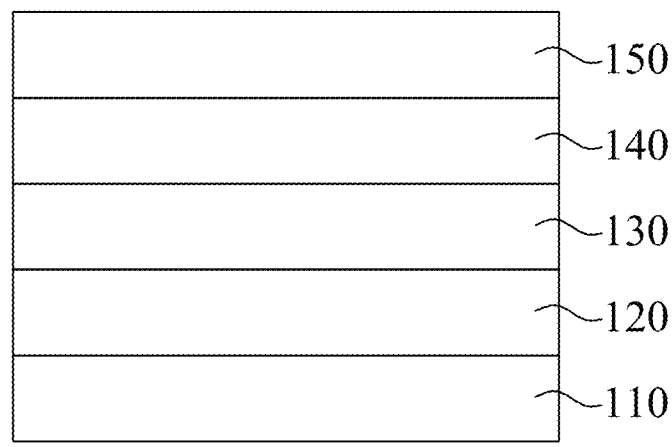
FIG. 1 is a sectional schematic view of a conventional deep ultraviolet light emitting diode.
Figure 2:
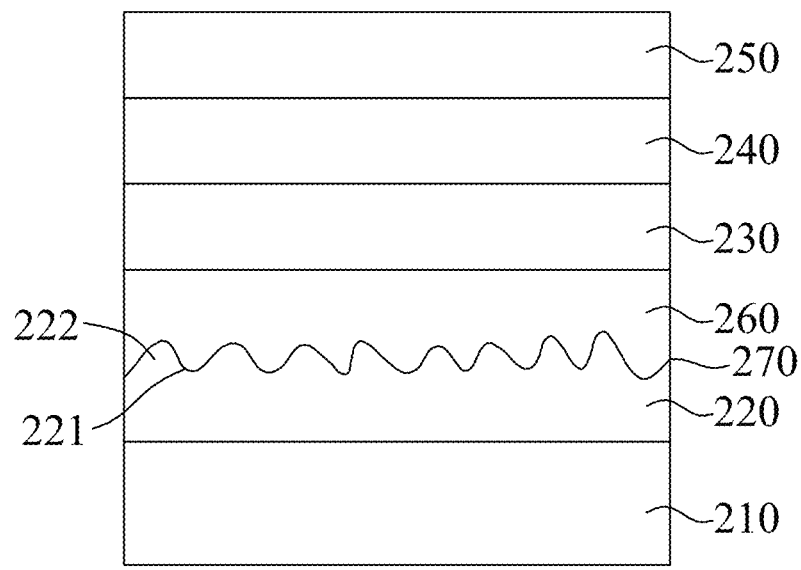
FIG. 2 is a sectional schematic view of an embodiment of a nitride based semiconductor device according to the disclosure.

Referring to FIG. 2, a first embodiment of a nitride based semiconductor device according to the disclosure includes a substrate 210 for epitaxial growth thereon, a buffer layer 220 formed on the substrate 210, a three-dimensional stress tuning layer 260 formed on the buffer layer 220, a first-type semiconductor layer 230 formed on the three-dimensional stress tuning layer 260, an active layer 240 formed on the first-type semiconductor layer 230, and a second-type semiconductor layer 250 formed on the active layer 240. In this embodiment, the buffer layer 220 is made from aluminum nitride (AlN). The first-type semiconductor layer 230 is an n-type semiconductor layer. The second-type semiconductor layer 250 is a p-type semiconductor layer. The nitride based semiconductor device may further include an anode formed on the first-type semiconductor layer 230 and a cathode formed on the second-type semiconductor layer 250.

In this embodiment, epitaxial growth of the buffer layer 220, the three-dimensional stress tuning layer 260, the first-type semiconductor layer 230, the active layer 240 and the second-type semiconductor layer 250 in sequence on the substrate 210 is exemplified to be performed using metal organic chemical-vapor deposition (MOCVD) technique, and the substrate 210 is exemplified to be a sapphire substrate.

The buffer layer 220 formed on the substrate 210 has a thickness greater than 100 nanometers. In certain embodiments, the thickness is between 1000 nanometers and 3000 nanometers. The three-dimensional stress tuning layer 260 and the buffer layer 220 cooperatively define an interface 270 therebetween. The buffer layer 220 has an irregular top surface that is connected to the three-dimensional stress tuning layer 260 and that cooperates with the three-dimensional stress tuning layer 260 to define the interface 270. The irregular top surface of the buffer layer 220 includes a base portion 221 and a plurality of protruding portions 222 protruding from the base portion 221, each of the protruding portions 222 having a height larger than 10 nanometers from the base portion 221. In certain embodiments, the width of each protruding portion 222 is larger than 100 nanometers. The irregular top surface of the buffer layer 220 may be formed under growth conditions including a relatively low growth temperature and a relatively high ratio of Group V/III, where the growth temperature is between 1000° C. and 1350° C. and the ratio of Group V/III is larger than 1500. An excess of ammonia gas may cause pre-reaction problems for organic metal sources for forming the buffer layer 220. In this embodiment, the growth temperature is exemplified to be at 1200° C. and the ratio of Group V/III is exemplified to be between 2000 and 3000.

The three-dimensional stress tuning layer 260 grown on the buffer layer 220 has a growth temperature between 1000° C. and 1300° C., a thickness between 100 nanometers and 5000 nanometers, and has a lattice constant larger than that of the buffer layer 220. The three-dimensional stress tuning layer 260 may have a structure formula of $Al_xGa_y$ $In_{1-x-y}N$, where x≥0, y>0, and x+y≤1. The flux of aluminum and gallium may be controlled to modify the lattice constant of the three-dimensional stress tuning layer 260. In this embodiment, x is between 0.2 and 0.9. In certain embodiments, x is between 0.5 and 0.9.

The n-type semiconductor layer for the first-type semiconductor layer may have a structure formula of $Al_{x1}Ga_{1-x1}N$ where x1 is between 0.5 and 1.

The active layer 240 has a quantum well structure with a structural formula of $Al_{x2}Ga_{1-x2}N/Al_{x3}Ga_{1-x3}N$, wherein x2<x3, x2 is between 0.3 and 0.9, and x3 is between 0.6 and 1. In certain embodiments, x2 is 0.4 and x3 is 0.6.

The second-type semiconductor layer 250 may include a p-type aluminum gallium nitride (AlGaN) barrier layer having a structural formula of $Al_{x4}Ga_{1-x4}N$, where x4 is between 0.3 and 0.9, a magnesium-doped p-type AlGaN layer also having a structural formula of $Al_{x4}Ga_{1-x4}N$, and a magnesium-doped p-type gallium nitride (GaN) layer.

Figure 3:
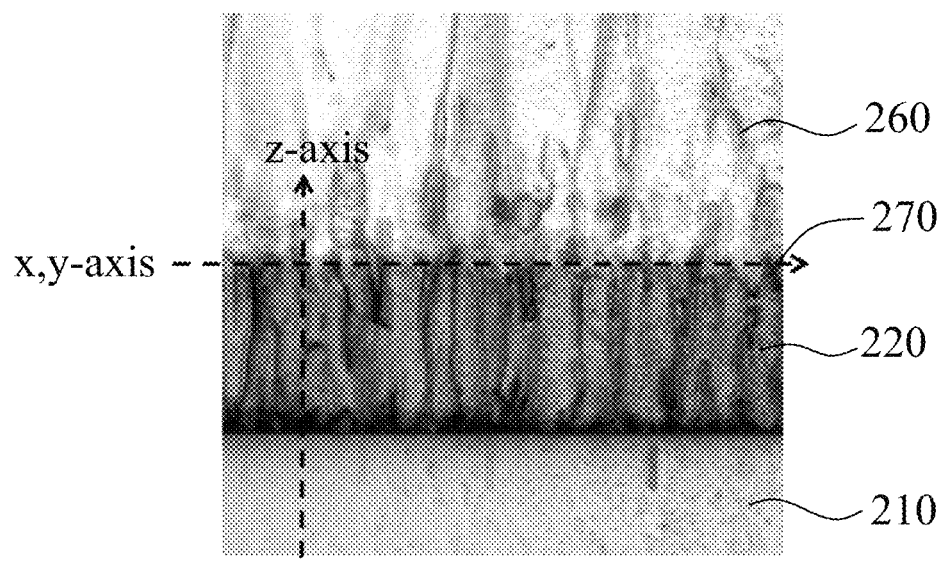
FIG. 3 is a transmission electron microscope image illustrating a three-dimensional stress tuning layer of the embodiment.
Figure 4:
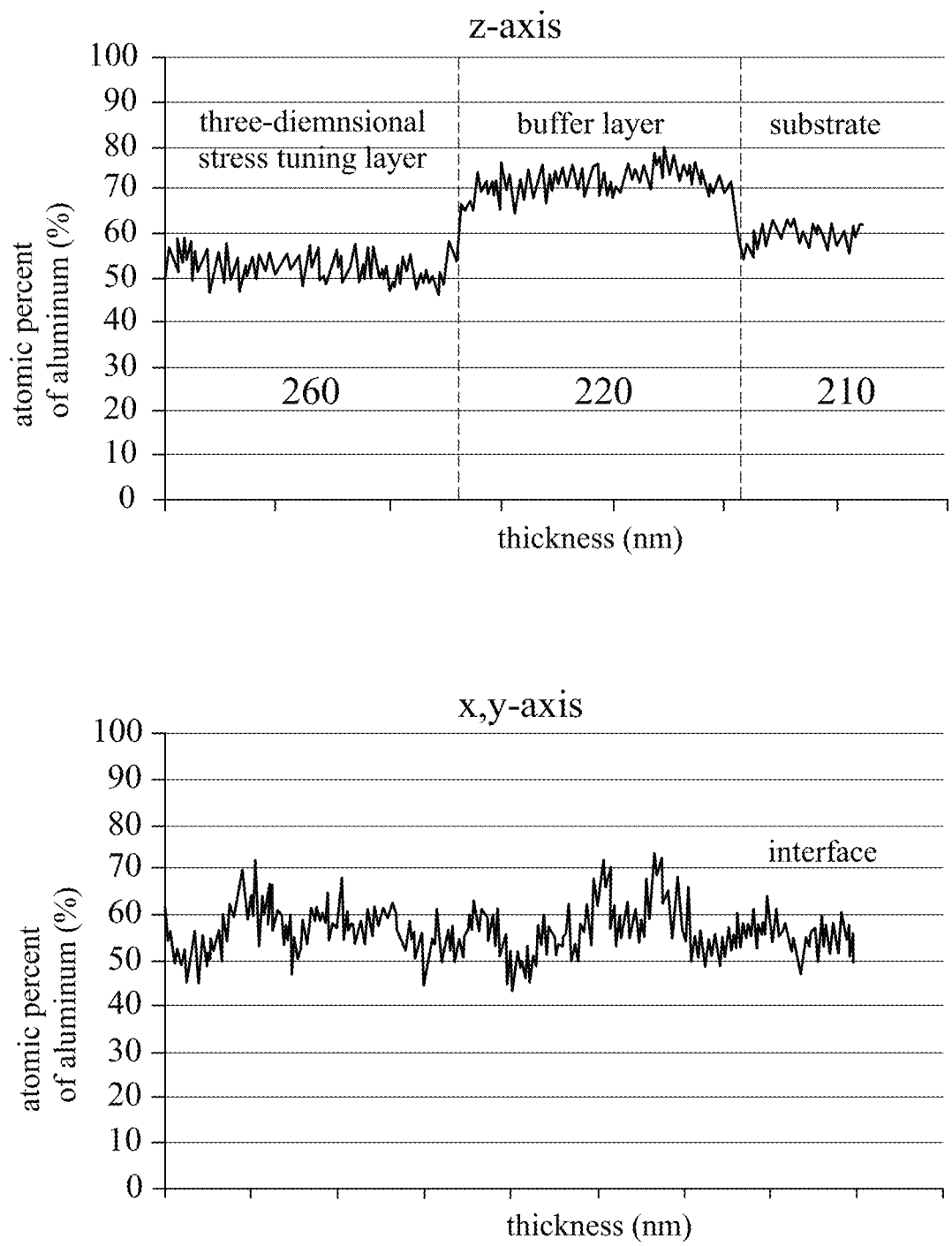
FIG. 4 is a graph of an aluminum content distribution of the embodiment measured using energy dispersive x-ray spectroscopy.

In this embodiment, the interface 270 has a three-dimensional composition distribution. FIG. 3 shows a transmission electron microscope image of the three-dimensional stress tuning layer 260 and FIG. 4 shows an aluminum content measured using energy-dispersive x-ray (EDX) spectroscopy. As can be seen from FIG. 4, the aluminum content distribution decreases along a growth direction from the buffer layer 220 of AlN to the three-dimensional stress tuning layer 260, and is irregular on the interface 270, which allows stress to be released three-dimensionally.

In this embodiment, the lattice constant of the stress tuning layer 260 is between that of the buffer layer 220 of AlN and the first-type semiconductor layer 230 of $Al_{x1}Ga_{1-x1}N$. If the stress tuning layer 260 is grown at a relatively high temperature, the adjustment of the aluminum content may be based on a growth parameter of the first-type semiconductor layer 230. For example, a flux of trimethyl aluminum (TMAl) may be fixed while a flux of trimethyl gallium (TMGa) is varied. For example, when the flux of TMGa for growing the first-type semiconductor layer 230 is designated by f1 and the flux of TMGa for growing the three-dimensional stress tuning layer 260 is designated by f2, the f1 and f2 may satisfy the relation of 0<f2<f1. Alternatively, the f1 and f2 may satisfy an equation of f2=f1/2. The flux of TMGa may be fixed while varying the flux of the TMAl in a similar manner.

In this embodiment, the aluminum content may also be controlled by controlling the respective growth temperatures of the buffer layer 220 of AlN, three-dimensional stress tuning layer 260 of $Al_xGa_{1-x}N$ and the first-type semiconductor layer 230 of $Al_{x1}Ga_{1-x1}N$. For example, when the growth temperature of the stress tuning layer 260 is designated to be T1, the growth temperature of the buffer layer 220 is designated to be T2, and the growth temperature of the first-type semiconductor layer 230 is designated to be T3, the T1, T2 and T3 may satisfy a relation of T3<T1<T2. Alternatively, the T1, T2 and T3 may satisfy an equation of T1=(T2+T3)/2.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A nitride based semiconductor device, comprising a buffer layer made from aluminum nitride (AlN);
   a three-dimensional stress tuning layer formed on said buffer layer and having a structure formula of $Al_xGa_yIn_{1-x-y}N$, where x≥0, y>0, x+y≤1;
   a first-type semiconductor layer directly formed on said three-dimensional stress tuning layer and having a structure formula of $Al_{x1}Ga_{1-x1}N$, where x1 is between 0.5 and 1;
   an active layer formed on said first-type semiconductor layer; and
   a second-type semiconductor layer formed on said active layer,
   wherein said buffer layer has an irregular top surface disposed in contact with said three-dimensional stress tuning layer, said buffer layer cooperating with said three-dimensional stress tuning layer to define an interface therebetween, said interface having a three-dimensional composition distribution,
   wherein a lattice constant of said three-dimensional stress tuning layer ranges between a lattice constant of said buffer layer and a lattice constant of said first-type semiconductor layer.

2. The nitride based semiconductor device as claimed in claim 1, wherein said first-type semiconductor layer is an n-type semiconductor layer, and said second-type semiconductor layer is a p-type semiconductor layer.

3. The nitride based semiconductor device as claimed in claim 1, wherein said three-dimensional stress tuning layer has an aluminum content that is smaller than an aluminum content of said buffer layer said aluminum content of said three-dimensional stress tuning layer being irregular on the interface.

4. The nitride based semiconductor device as claimed in claim 1, wherein said three-dimensional stress tuning layer has a lattice constant larger than that of said buffer layer.

5. The nitride based semiconductor device as claimed in claim 1, wherein x ranges between 0.2 and 0.9.

6. The nitride based semiconductor device as claimed in claim 1, wherein said three-dimensional stress tuning layer has a growth temperature between 1000° C. and 1300° C.

7. The nitride based semiconductor device as claimed in claim 1, wherein said three-dimensional stress tuning layer has a thickness between 100 nanometers and 5000 nanometers.

8. The nitride based semiconductor device as claimed in claim 1, wherein said irregular top surface of said buffer layer includes a base portion and a plurality of extending portions protruding from said base portion, each of said protruding portions having a height larger than 10 nanometers from said base portion.

9. The nitride based semiconductor device as claimed in claim 1, wherein said buffer layer has a thickness greater than 100 nanometers.

\* \* \* \* \*